US007456612B2

(12) United States Patent
Murakami

(10) Patent No.: US 7,456,612 B2
(45) Date of Patent: Nov. 25, 2008

(54) METHOD FOR ESTIMATING POLARIZATION VOLTAGE OF SECONDARY CELL, METHOD AND DEVICE FOR ESTIMATING REMAINING CAPACITY OF SECONDARY CELL, BATTERY PACK SYSTEM, AND VEHICLE

(75) Inventor: Yusai Murakami, Hamamatsu (JP)

(73) Assignee: Panasonic EV Energy Co., Ltd., Shizouka (JP)

( * ) Notice: Subject to any disclaimer, the term of this patent is extended or adjusted under 35 U.S.C. 154(b) by 153 days.

(21) Appl. No.: 10/487,104

(22) PCT Filed: Dec. 2, 2002

(86) PCT No.: PCT/JP02/12613

§ 371 (c)(1),
(2), (4) Date: Feb. 17, 2004

(87) PCT Pub. No.: WO03/061054

PCT Pub. Date: Jul. 24, 2003

(65) Prior Publication Data

US 2004/0257087 A1 Dec. 23, 2004

(30) Foreign Application Priority Data

Dec. 27, 2001 (JP) .............................. 2001-398110

(51) Int. Cl.
*H02J 7/00* (2006.01)
*G01N 27/416* (2006.01)
(52) U.S. Cl. ...................... 320/132; 324/432
(58) Field of Classification Search ................ 320/132, 320/134, 136; 324/425–433
See application file for complete search history.

(56) References Cited

U.S. PATENT DOCUMENTS

| 6,621,250 | B1 | 9/2003 | Ohkubo et al. |
| 6,661,231 | B1 | 12/2003 | Arai et al. |
| 6,696,818 | B2 * | 2/2004 | Arai et al. ................ 320/132 |
| 2003/0097225 | A1 * | 5/2003 | Teruo ...................... 702/63 |

FOREIGN PATENT DOCUMENTS

| JP | 2000-258514 | 9/2000 |
| JP | 2001-223033 | 8/2001 |
| WO | WO-9961929 | * 12/1999 |

OTHER PUBLICATIONS

David Linden, Handbook of Batteries, 1994, McGraw-Hill inc., Second Edition, pp. 2.1-2.2.*
Machine translation of JP-2001223033.*

* cited by examiner

*Primary Examiner*—Akm E Ullah
*Assistant Examiner*—Richard V Muralidar
(74) *Attorney, Agent, or Firm*—Workman Nydegger

(57) ABSTRACT

There is provided a battery pack system with enhanced estimation accuracies of a polarization voltage and a remaining capacity of a secondary battery. A polarization voltage calculation section 108 calculates a polarization voltage Vpol from a filtered variation LPF ($\Delta$Q) of an accumulated capacity with reference to a look-up table (LUT) 1081. An electromotive force calculation section 113 subtracts the polarization voltage Vpol from an effective no-load voltage $V0_{OK}$ to determine a battery electromotive force Veq. A remaining capacity estimation section 114 estimates a remaining capacity SOC from the battery electromotive force Veq with reference to a look-up table (LUT) 1141.

18 Claims, 9 Drawing Sheets

METHOD FOR ESTIMATING POLARIZATION VOLTAGE OF SECONDARY CELL, METHOD AND DEVICE FOR ESTIMATING REMAINING CAPACITY OF SECONDARY CELL, BATTERY PACK SYSTEM, AND VEHICLE

TECHNICAL FIELD

The present invention relates to a method for estimating the remaining capacity (SOC: State of Charge) of a secondary battery such as a nickel-metal hydride (Ni-MH) battery to be mounted as a power source for a motor and a driving source for various loads, in motor-driven vehicles such as a pure electric vehicle (PEV), a hybrid electric vehicle (HEV), a hybrid vehicle with a fuel cell and a battery, or the like.

BACKGROUND ART

Conventionally, in an HEV, when an output from an engine is large with respect to motive power required for driving, an electric generator is driven with surplus motive power to charge a secondary battery. On the other hand, when an output from an engine is small, a motor is driven with the electric power from a secondary battery to output supplementary motive power. In this case, a secondary battery is discharged. When a secondary battery is mounted on an HEV or the like, it is necessary to maintain an appropriate operation state by controlling such charging/discharging, etc.

For this purpose, the voltage, current, temperature, and the like of a secondary battery are detected, and the remaining capacity (hereinafter, abbreviated as an "SOC") of the secondary battery is estimated by computation, whereby an SOC is controlled so as to optimize the fuel consumption efficiency of a vehicle. Furthermore, at this time, in order to allow a power assist based on motor driving during acceleration to be operated and to allow energy to be collected (regenerative braking) during deceleration with good balance, an SOC level is controlled as follows. Generally, in order to set an SOC to be, for example, in a range of 50% to 70%, when the SOC decreases to, for example, 50%, control for excess charging is performed. On the other hand, when the SOC increases to, for example, 70%, control for excess discharging is performed. Thus, it is attempted to approximate the SOC to the center of control.

In order to control the SOC exactly, it is necessary to estimate exactly the SOC of a secondary battery that is being charged/discharged. Examples of such a conventional method for estimating an SOC include the following two kinds of methods.

(1) A charging/discharging current is measured. The value of the current (having a minus sign in the case of charging, and having a plus sign in the case of discharging) is multiplied by a charging efficiency. The multiplied values are accumulated over a certain period of time to calculate an accumulated capacity. Then, an SOC is estimated based on the accumulated capacity.

(2) A plurality of data sets of charging/discharging currents and terminal voltages of a secondary battery corresponding thereto are measured and stored. A primary approximate line (voltage V-current I approximate line) is obtained from the data sets by least squares, and a voltage value (V intercept of a V-I approximate line) corresponding to a current value 0 (zero) is calculated as a no-load voltage (V0). Then, an SOC is estimated based on the no-load voltage V0.

Furthermore, when a secondary battery is charged/discharged, a polarization voltage is generated with respect to a battery electromotive force. More specifically, a voltage increases during charging, whereas a voltage decreases during discharging. This change is called a polarization voltage. In the case of estimating an SOC from a voltage as in the above-mentioned method (2), in the case of estimating an increase and a decrease in a voltage during a predetermined time, and in the case of obtaining electric power that can be input/output during a predetermined time, it is necessary to grasp a polarization voltage exactly.

In general, as a method for estimating a polarization voltage, a primary regression line is obtained from a plurality of current and voltage data, the slope of the line is set to be a polarization resistance (component resistance, reaction resistance, and diffusion resistance), and the polarization resistance is multiplied by a current to obtain a polarization voltage.

However, the above-mentioned two kinds of conventional SOC estimation methods have the following problems.

First, in the case of the SOC estimation method based on an accumulated capacity in the above method (1), a charging efficiency required for accumulating current values depends upon an SOC value, a current value, a temperature, and the like. Therefore, it is difficult to find a charging efficiency suitable for these various kinds of conditions. Furthermore, in the case where a battery is sitting left, a self-discharge amount during that time cannot be calculated. For these reasons and the like, the difference between the true value of an SOC and the estimated value thereof increases with the passage of time. Therefore, in order to eliminate this, it is necessary to perform complete discharging or full charging to initialize the SOC.

However, in the case where a secondary battery is mounted on an HEV, when complete discharging is performed, the secondary battery cannot supply electric power, which becomes a burden on an engine. Therefore, it is necessary to initialize an SOC after stopping a vehicle at a charging site and the like and completely discharging the secondary battery, or after charging the secondary battery over a predetermined period of time until it is fully charged. Thus, in the case of the application to an HEV, it is impossible to perform complete charging/discharging during driving of a vehicle so as to initialize an SOC. Furthermore, periodically performing complete charging/discharging of a secondary battery mounted on an HEV is inconvenient for a user, and also becomes a burden on the user.

Next, in the case of the SOC estimation method based on a no-load voltage in the above method (2), first, a V intercept of a V-I approximate line after large discharging becomes relatively low, and a V intercept of the V-I approximate line after large charging becomes relatively high. Thus, a no-load voltage is varied even at the same SOC, depending upon the past history of a charging/discharging current. This change is caused by a polarization voltage. Accordingly, the no-load voltage that is a V intercept of a V-I approximate line is varied between a charging direction and a discharging direction, due to the factor of a polarization voltage. Because of this, the difference in voltage results in an estimation error of an SOC. Furthermore, a decrease in voltage due to a memory effect and leaving a battery sitting, battery degradation, and the like also cause an estimation error of an SOC.

Furthermore, according to the above-mentioned conventional method for estimating a polarization voltage, when a polarization voltage is obtained from a polarization resistance, a reaction resistance due to the reaction between an active material of a battery and an interface of an electrolyte solution and a diffusion resistance due to the reaction in active materials, between active materials, and in an electrolyte solution, included in a polarization resistance, cannot be estimated sufficiently. Therefore, the accuracy of an estimated polarization voltage is unsatisfactory. Accordingly, it is not practical to use a no-load voltage in the above method (2) for correction, in order to obtain a battery electromotive force for estimating an SOC.

DISCLOSURE OF INVENTION

The present invention has been achieved in view of the above problems, and its object is to provide a method for estimating a polarization voltage of a secondary battery with high accuracy; a method and apparatus for estimating an SOC with high accuracy based on the estimation of a polarization voltage, without periodically performing complete charging/discharging of a secondary battery to initialize the SOC; a battery pack system with a computer system (electronic control unit for a battery (battery ECU)) mounted thereon for performing processing in the method; and a motor-driven vehicle with the battery pack system mounted thereon.

In order to achieve the above-mentioned object, a first method for estimating a polarization voltage of a secondary battery according to the present invention includes the steps of: measuring a current flowing through a secondary battery; calculating an accumulated capacity based on the measured current; obtaining a variation of the calculated accumulated capacity during a predetermined period of time; and obtaining a polarization voltage based on the variation of the accumulated capacity.

In order to achieve the above-mentioned object, a second method for estimating a polarization voltage of a secondary battery according to the present invention includes the steps of: measuring a current flowing through a secondary battery used in an intermediately charged state as a power source for a motor and a driving source for a load; calculating an accumulated capacity based on the measured current; obtaining a variation of the calculated accumulated capacity during a predetermined period of time; and obtaining a polarization voltage based on the variation of the accumulated capacity.

According to the above-mentioned method for estimating a polarization voltage, a polarization voltage is obtained based on the variation of the accumulated capacity, instead of estimating the polarization voltage based on a polarization resistance with unsatisfactory estimation accuracy, including a reaction resistance and a diffusion resistance, whereby the polarization voltage can be estimated with high accuracy.

It is preferable that the first and second methods for estimating a polarization voltage of a secondary battery further include the step of subjecting the obtained variation of the accumulated capacity to time delay processing.

According to the above method, the polarization voltage having a delay time with respect to the variation of the accumulated capacity can be estimated following the variation of the accumulated capacity in real time.

Furthermore, in the first and second methods for estimating a polarization voltage of a secondary battery, it is preferable that the variation of the accumulated capacity is subjected to averaging processing by filtering as well as the time delay processing.

According to the above method, a fluctuation component of the accumulated capacity that is not required for calculating a polarization voltage can be reduced.

Furthermore, in the first and second methods for estimating a polarization voltage of a secondary battery, it is preferable that characteristics of a polarization voltage with respect to the variation of the accumulated capacity with a temperature being a parameter are previously obtained, and a polarization voltage is obtained with reference to a look-up table or a formula storing the characteristics.

According to the above method, a polarization voltage can be obtained easily with good accuracy, even with respect to a temperature change in a battery.

Furthermore, in the first and second methods for estimating a polarization voltage of a secondary battery, the secondary battery is a nickel-metal hydride secondary battery.

In order to achieve the above-mentioned object, a first battery pack system according to the present invention includes a computer system for performing the first or second method for estimating a polarization voltage of a secondary battery and a secondary battery.

In order to achieve the above-mentioned object, a battery pack system including a computer system for performing the second method for estimating a polarization voltage of a secondary battery and a secondary battery is mounted on a first motor-driven vehicle according to the present invention.

According to the above configuration, the battery pack system on which a battery ECU, for example, is mounted as a computer system can estimate a polarization voltage with good accuracy.

In order to achieve the above-mentioned object, a first method for estimating a remaining capacity of a secondary battery according to the present invention includes the steps of: measuring a data set of a current flowing through a secondary battery, and a terminal voltage of the secondary battery corresponding to the current to obtain a plurality of the data sets; calculating a voltage value in a case where a current value is zero based on the obtained plurality of data sets by statistical processing as a no-load voltage; calculating an accumulated capacity based on the measured current; obtaining a variation of the calculated accumulated capacity during a predetermined period of time; obtaining a polarization voltage based on the variation of the accumulated capacity; subtracting the polarization voltage from the no-load voltage to calculate an electromotive force of the secondary battery; and estimating a remaining capacity of the secondary battery based on the calculated electromotive force.

In order to achieve the above-mentioned object, a second method for estimating a remaining capacity of a secondary battery according to the present invention includes the steps of: measuring a data set of a current flowing through a secondary battery used in an intermediately charged state as a power source for a motor and a driving source for a load, and a terminal voltage of the secondary battery corresponding to the current to obtain a plurality of the data sets; calculating a voltage value in a case where a current value is zero based on the obtained plurality of data sets by statistical processing as a no-load voltage; calculating an accumulated capacity based on the measured current; obtaining a variation of the calculated accumulated capacity during a predetermined period of time; obtaining a polarization voltage based on the variation of the accumulated capacity; subtracting the polarization voltage from the no-load voltage to calculate an electromotive force of the secondary battery; and estimating a remaining capacity of the secondary battery based on the calculated electromotive force.

According to the above method for estimating a remaining capacity, since the estimation accuracy of a polarization voltage is satisfactory, the calculation accuracy of a battery electromotive force (equilibrium potential) obtained by subtracting a polarization voltage from a no-load voltage is enhanced, which enables an SOC to be estimated with high accuracy.

Furthermore, an SOC can be estimated based on an equilibrium potential, so that an SOC after self-discharging due to the leaving of a battery for a long period of time and the like also can be estimated, which makes it unnecessary to initialize the SOC periodically.

It is preferable that the first and second methods for estimating a remaining capacity of a secondary battery further include the step of subjecting the obtained variation of the accumulated capacity to time delay processing.

According to the above method, a polarization voltage having a delay time with respect to the variation of the accumulated capacity can be estimated following the variation of the accumulated capacity in real time.

In this case, it is preferable that a polarization voltage is obtained by multiplying the variation of the accumulated capacity subjected to the time delay processing by a predetermined coefficient.

According to the above method, a polarization voltage can be calculated easily.

Furthermore, in the first and second methods for estimating a remaining capacity of a secondary battery, it is preferable that the variation of the accumulated capacity is subjected to averaging processing by filtering as well as the time delay processing.

According to the above method, a fluctuation component of the accumulated capacity that is not required for calculating a polarization voltage can be reduced.

Furthermore, it is preferable that the first and second methods for estimating a remaining capacity of a secondary battery further include the step of subjecting a polarization voltage to time delay processing.

According to the above method, the remaining capacity having a delay time with respect to a polarization voltage can be estimated following the polarization voltage in real time.

In this case, it is preferable that averaging processing by filtering is performed as well as time delay processing.

According to the above method, a fluctuation component of the polarization voltage that is not required for estimating a remaining capacity can be reduced.

Furthermore, it is preferable that the first and second methods for estimating a remaining capacity of a secondary battery further include the step of subjecting both the variation of the accumulated capacity and the polarization voltage to time delay processing.

Furthermore, in the first and second methods for estimating a remaining capacity of a secondary battery, it is preferable that characteristics of a polarization voltage with respect to the variation of the accumulated capacity with a temperature being a parameter are previously obtained, and a polarization voltage is obtained with reference to a look-up table or a formula storing the characteristics.

According to the above method, a polarization voltage can be obtained easily with good accuracy, even with respect to a temperature change in a battery.

Furthermore, in the first and second methods for estimating a remaining capacity of a secondary battery, it is preferable that characteristics of a remaining capacity with respect to an electromotive force with a temperature being a parameter are previously obtained, and a remaining capacity is estimated with reference to a look-up table or a formula storing the characteristics.

According to the above method, a remaining capacity can be estimated easily with good accuracy, even with respect to a temperature change in a battery.

It is preferable that the first and second methods for estimating a remaining capacity of a secondary battery further include the step of selecting the obtained plurality of data sets based on a predetermined selection condition, and as the predetermined selection condition, in the case where the values of currents are in a predetermined range on a charging side and a discharging side, the number of the plurality of data sets is a predetermined number or more on the charging side and the discharging side, and the variation of the accumulated capacity while the plurality of data sets are being obtained is in a predetermined range, the plurality of data sets are selected.

According to the above method, a plurality of data sets can be obtained uniformly on the discharging side and the charging side without being influenced by the variation of the accumulated capacity.

It is preferable that the first and second methods for estimating a remaining capacity of a secondary battery further include the step of determining whether or not the calculated no-load voltage is effective based on a predetermined determination condition, and as the predetermined determination condition, in the case where a variance of a plurality of data sets with respect to an approximate line obtained by statistical processing using least squares is in a predetermined range, or a correlation coefficient between the approximate line and the plurality of data sets is equal to or more than a predetermined value, the calculated no-load voltage is determined to be effective.

According to the above method, the calculation accuracy of a no-load voltage can be enhanced.

In the first and second methods for estimating a remaining capacity of a secondary battery, the secondary battery is a nickel-metal hydride secondary battery.

In order to achieve the above-mentioned object, a second battery pack system according to the present invention includes a computer system for performing the first or second method for estimating a remaining capacity of a secondary battery and a secondary battery.

In order to achieve the above-mentioned object, a battery pack system including a computer system for performing a method for estimating a remaining capacity of a secondary battery and a secondary battery is mounted on a second motor-driven vehicle according to the present invention.

According to the above configuration, a battery pack system on which, for example, a battery ECU is mounted as a microcomputer exactly controls an SOC based on an SOC estimated with high accuracy, and can realize an excellent fuel consumption efficiency when mounted on a motor-driven vehicle such as an HEV or the like.

In order to achieve the above-mentioned object, a first apparatus for estimating a remaining capacity of a secondary battery according to the present invention includes: a current measuring section for measuring a current flowing through a secondary battery as current data; a voltage measuring section for measuring a terminal voltage of the secondary battery corresponding to the current as voltage data; a no-load voltage calculation section for calculating voltage data in a case where current data is zero as a no-load voltage by statistical processing, based on a plurality of data sets of the current data from the current measuring section and the voltage data from the voltage measuring section; an accumulated capacity calculation section for calculating an accumulated capacity based on current data from the current measuring section; a capacity change calculation section for obtaining a variation of the accumulated capacity during a predetermined period of time from the accumulated capacity calculation section; a polarization voltage calculation section for obtaining a polarization voltage based on the variation of the accumulated capacity from the capacity change calculation section; an electromotive force calculation section for subtracting a polarization voltage obtained in the polarization voltage calculation section from the no-load voltage calculated in the no-load voltage calculation section to calculate an electromotive force of the secondary battery; and a remaining capacity estimation section for estimating a remaining capacity of the secondary battery based on the electromotive force from the electromotive force calculation section.

In order to achieve the above-mentioned object, a second apparatus for estimating a remaining capacity of a secondary battery according to the present invention includes: a current measuring section for measuring a current flowing through a secondary battery used in an intermediately charged state as a power source for a motor and a driving source for a load as current data; a voltage measuring section for measuring a terminal voltage of the secondary battery corresponding to the current as voltage data; a no-load voltage calculation section for calculating voltage data in a case where current data is zero as a no-load voltage by statistical processing, based on a plurality of data sets of the current data from the current measuring section and the voltage data from the voltage measuring section; an accumulated capacity calculation section for calculating an accumulated capacity based on current data from the current measuring section; a capacity change calculation section for obtaining a variation of the accumulated capacity during a predetermined period of time from the accumulated capacity calculation section; a polarization voltage calculation section for obtaining a polarization voltage based on the variation of the accumulated capacity from the capacity change calculation section; an electromotive force calculation section for subtracting a polarization voltage obtained in the polarization voltage calculation section from the no-load voltage calculated in the no-load voltage calculation section to calculate an electromotive force of the secondary battery; and a remaining capacity estimation section for estimating a remaining capacity of the secondary battery based on the electromotive force from the electromotive force calculation section.

According to the above configuration, since the estimation accuracy of a polarization voltage is satisfactory, the calculation accuracy of a battery electromotive force (equilibrium potential) obtained by subtracting a polarization voltage from a no-load voltage is enhanced, which enables an SOC to be estimated with high accuracy.

Furthermore, an SOC can be estimated based on an equilibrium potential, so that an SOC after self-discharging due to a battery being left for a long period of time and the like also can be estimated, which makes it unnecessary to periodically initialize the SOC.

It is preferable that the first and second apparatuses for estimating a remaining capacity of a secondary battery further include a first computation section for subjecting the variation of the accumulated capacity from the capacity change calculation section to time delay processing.

According to the above configuration, a polarization voltage having a delay time with respect to the variation of the accumulated capacity can be estimated following the variation of the accumulated capacity in real time.

In the first and second apparatuses for estimating a remaining capacity of a secondary battery, it is preferable that the polarization voltage calculation section multiplies the variation of the accumulated capacity subjected to the time delay processing in the first computation section by a predetermined coefficient to obtain a polarization voltage.

According to the above configuration, a polarization voltage can be calculated easily.

Furthermore, in the first and second apparatuses for estimating a remaining capacity of a secondary battery, it is preferable that the first computation section subjects the variation of the accumulated capacity to averaging processing by filtering as well as the time delay processing.

According to the above configuration, a fluctuation component of the accumulated capacity that is not required for calculating a polarization voltage can be reduced.

It is preferable that the first and second apparatuses for estimating a remaining capacity of a secondary battery further include a second computation section for subjecting a polarization voltage to time delay processing.

According to the above configuration, a remaining capacity having a delay time with respect to a polarization voltage can be estimated following the polarization voltage in real time.

In this case, it is preferable that the second computation section performs averaging processing by filtering as well as time delay processing.

According to the above configuration, a fluctuation component of the polarization voltage that is not required for estimating a remaining capacity can be reduced.

It is preferable that the first and second apparatuses for estimating a remaining capacity of a secondary battery further include both a first computation section and a second computation section.

It is preferable that the first and second apparatuses for estimating a remaining capacity of a secondary battery further include a temperature measuring section for measuring a temperature of a secondary battery, and the polarization voltage calculation section obtains a polarization voltage based on the temperature measured in the temperature measuring section and a previously obtained look-up table or formula storing characteristics of the polarization voltage with respect to the variation of the accumulated capacity with a temperature being a parameter.

According to the above configuration, a polarization voltage can be obtained easily with good accuracy, even with respect to a temperature change in a battery.

Also, it is preferable that the first and second apparatuses for estimating a remaining capacity of a secondary battery further include a temperature measuring section for measuring a temperature of a battery, and the remaining capacity estimation section estimates a remaining capacity based on the temperature measured in the temperature measuring section and a previously obtained look-up table or formula storing characteristics of the remaining capacity with respect to an electromotive force with a temperature being a parameter.

According to the above configuration, a remaining capacity can be estimated easily with good accuracy, even with respect to a temperature change in a battery.

Also, it is preferable that the first and second apparatuses for estimating a remaining capacity of a secondary batter further include a data set selection section for selecting a plurality of data sets based on a predetermined selection condition and outputting them to a no-load voltage calculation section, and as the predetermined selection condition, in the case where the values of currents are in a predetermined range on a charging side and a discharging side, the number of the plurality of data sets is a predetermined number or more on the charging side and the discharging side, and the variation of the accumulated capacity while the plurality of data sets are being obtained is in a predetermined range, the data set selection section selects the plurality of data sets.

According to the above configuration, a plurality of data sets can be obtained uniformly on the discharging side and the charging side without being influenced by the variation of the accumulated capacity.

Also, it is preferable that the first and second apparatuses for estimating a remaining capacity of a secondary battery further include a no-load voltage determination section for determining whether or not a no-load voltage calculated in the no-load voltage calculation section is effective based on a predetermined determination condition, and as the predetermined determination condition, in the case where a variance of a plurality of data sets with respect to an approximate line obtained by statistical processing using least squares is in a predetermined range, or a correlation coefficient between the approximate line and the plurality of data sets is equal to or more than a predetermined value, the calculated no-load voltage is determined to be effective.

According to the above configuration, the calculation accuracy of a no-load voltage can be enhanced.

In the first and second apparatuses for estimating a remaining capacity of a secondary battery, the secondary battery is a nickel-metal hydride secondary battery.

In order to achieve the above-mentioned object, a third battery pack system according to the present invention includes a first or second apparatus for estimating a remaining capacity of a secondary battery and a secondary battery. In this case, it is preferable that the first and second apparatuses for estimating a remaining capacity of a secondary battery is configured as a computer system.

In order to achieve the above-mentioned object, a battery pack system including the second apparatus for estimating a remaining capacity of a secondary battery and a secondary battery is mounted on a third motor-driven vehicle according to the present invention. In this case, it is preferable that the second apparatus for estimating a remaining capacity of a secondary battery is configured as a computer system.

According to the above configuration, the battery pack system on which a battery ECU, for example, is mounted as a microcomputer system can control an SOC exactly based on an SOC estimated with high accuracy, and realize an excellent fuel consumption efficiency when mounted on a motor-driven vehicle such as an HEV and the like.

BEST MODE FOR CARRYING OUT THE INVENTION

Hereinafter, the present invention will be described by way of preferred embodiments with reference to the drawings.

Figure 1:
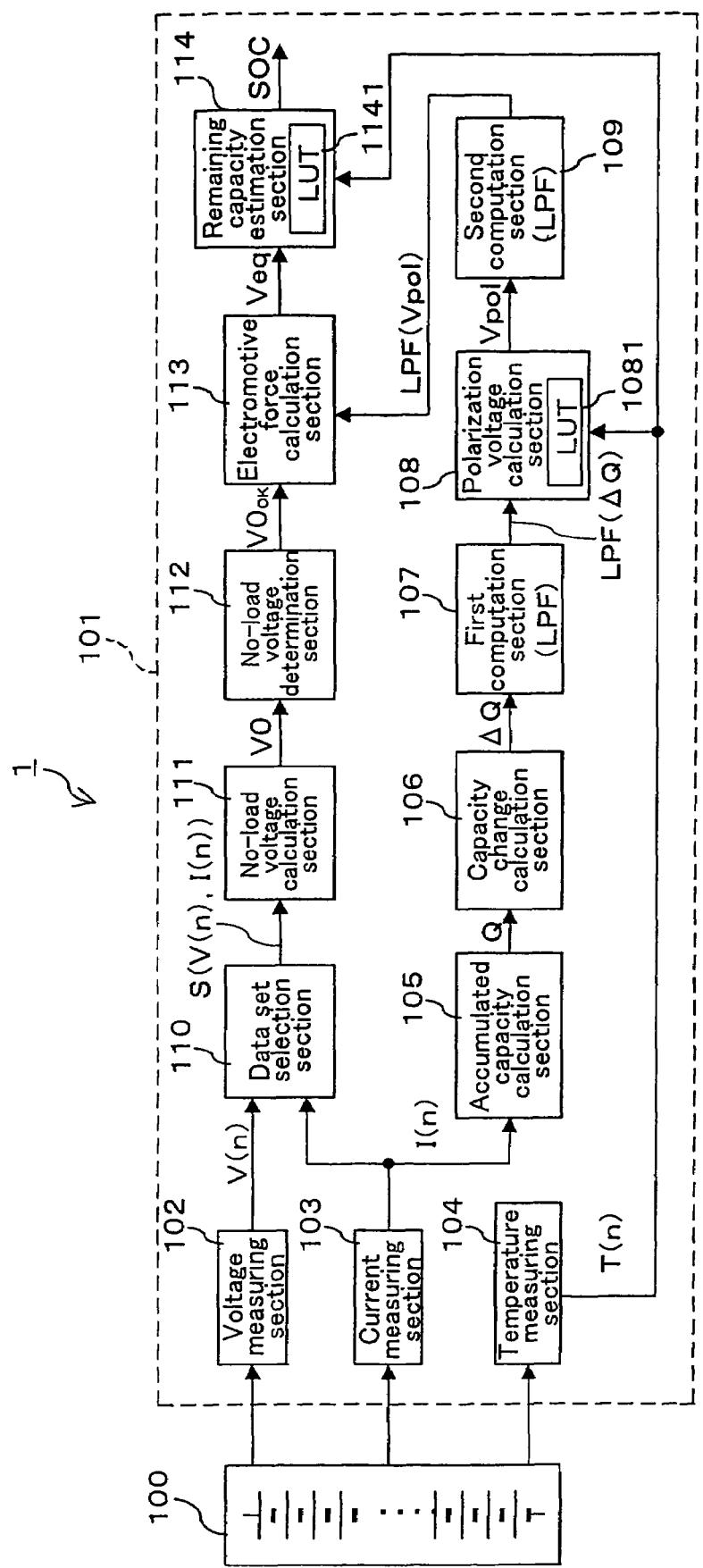
FIG. 1 is a block diagram showing an exemplary configuration of a battery pack system according to one embodiment of the present invention.

FIG. 1 is a block diagram showing an exemplary configuration of a battery pack system according to one embodiment of the present invention. In FIG. 1, a battery pack system 1 is composed of a secondary battery 100 in which a plurality of cells are combined, and a battery ECU 101 including an apparatus for estimating a remaining capacity according to the present invention, as a part of a microcomputer system.

In the battery ECU 101, reference numeral 102 denotes a voltage measuring section for measuring a terminal voltage of the secondary battery 100 detected by a voltage sensor (not shown) at a predetermined sampling period as voltage data V(n), 103 denotes a current measuring section for measuring a charging/discharging current of the secondary battery 100 detected by the current sensor (not shown) at a predetermined sampling as current data I(n) (the sign of which represents either a charging direction or a discharging direction), and 104 denotes a temperature measuring section for measuring a temperature of the secondary battery 100 detected by the temperature sensor (not shown) as temperature data T(n).

Figure 2:
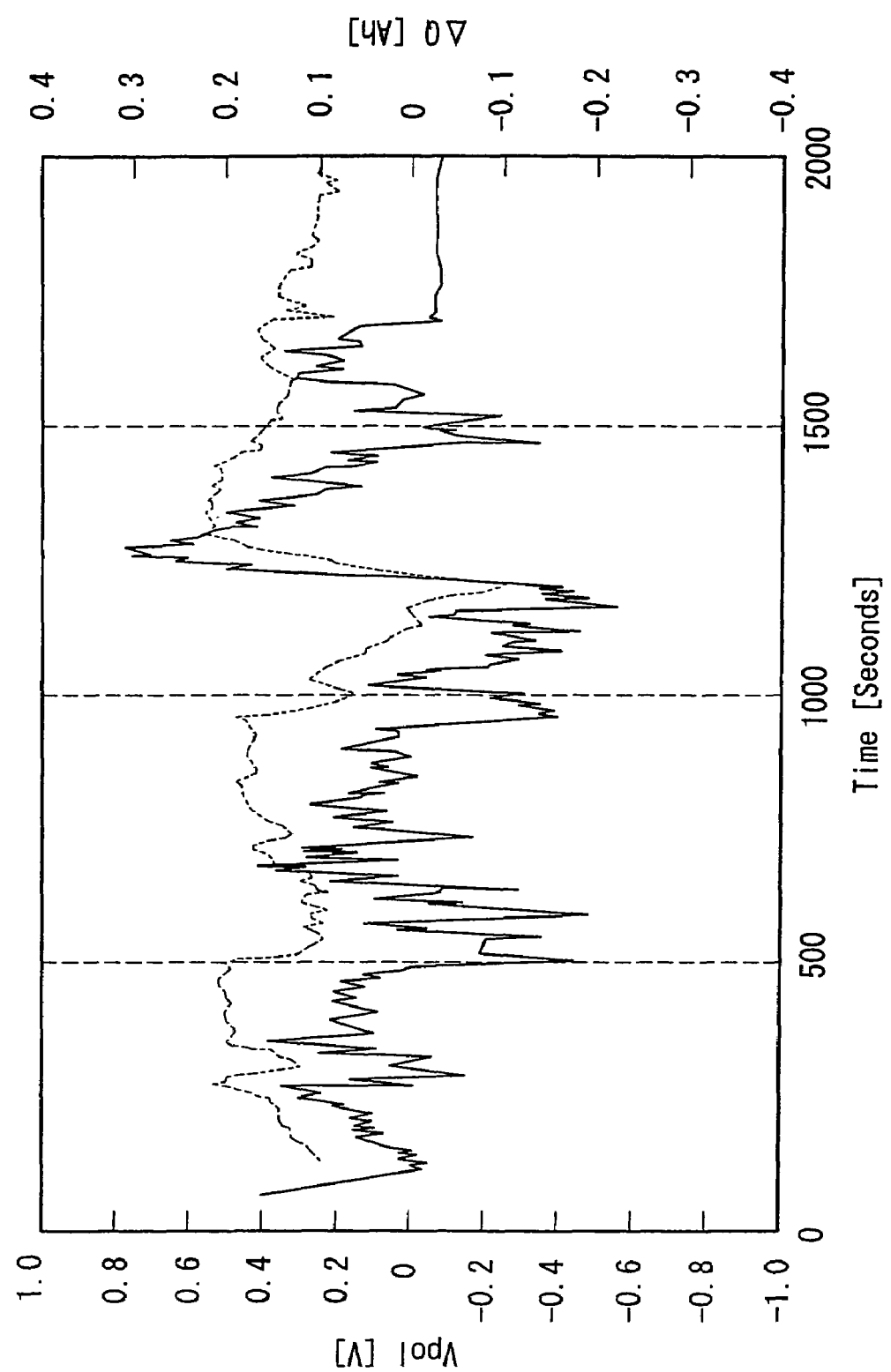
FIG. 2 is a diagram showing an example of a variation $\Delta Q$ of an accumulated capacity and a change in a polarization voltage Vpol with the passage of time.

The current data I(n) from the current measuring section 103 is input to an accumulated capacity calculation section 105, and an accumulated capacity Q during a predetermined period of time is calculated. The accumulated capacity Q calculated in the accumulated capacity calculation section 105 is input to a capacity change calculation section 106, and a variation $\Delta Q$ of the accumulated capacity Q during a predetermined period of time (e.g., one minute) is obtained. The variation $\Delta Q$ of the accumulated capacity is input to a first computation section 107 that functions as a low-pass filter (LPF). In the first computation section 107, time delay processing for adjusting the timing between the variation $\Delta Q$ of the accumulated capacity and the polarization voltage obtained in a subsequent polarization voltage calculation section 108 and averaging processing for removing a fluctuation component corresponding to an unnecessary high-frequency component are performed, and the result is output as LPF ($\Delta Q$). Herein, FIG. 2 shows, as an example, a variation $\Delta Q$ of an accumulated capacity during the past one minute as a solid line, and a polarization voltage Vpol as a broken line. It is understood from FIG. 2 that the polarization voltage Vpol is changed after tens of seconds from the variation $\Delta Q$ of the accumulated capacity during the past one minute. Corresponding to this time delay, a time constant $\tau$ of the LPF (in the present embodiment, the LPF is composed of a primary delay element) constituting the first computation section 107 is determined.

Figure 3:
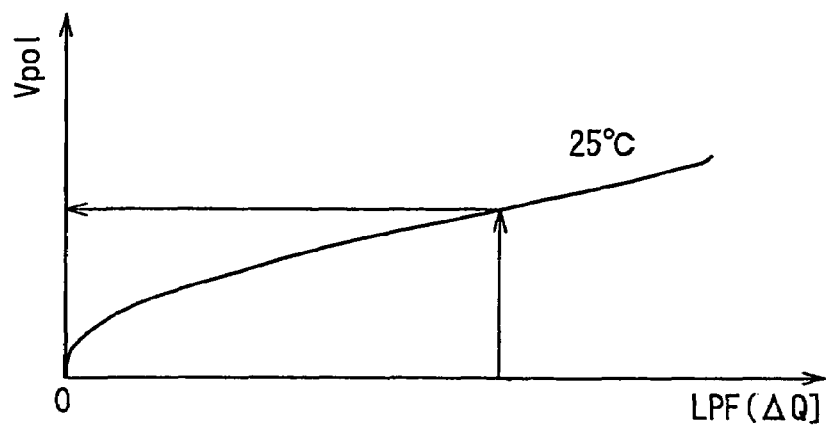
FIG. 3 is a diagram showing a characteristic curve of a polarization voltage Vpol with respect to a variation LPF ($\Delta Q$) of an accumulated capacity after filtering, with a temperature being a parameter, in the present embodiment.

The LPF ($\Delta Q$) from the first computation section 107 is input to the polarization voltage calculation section 108. In the polarization voltage calculation section 108, the polarization voltage Vpol is calculated based on the temperature data T(n) measured in the temperature measuring part 104, from a characteristic curve or a formula of the polarization voltage Vpol with respect to the LPF ($\Delta Q$) with a temperature being a parameter, previously stored in a look-up table (LUT) 1081. Herein, FIG. 3 shows a characteristic curve of the polarization voltage Vpol with respect to the LPF ($\Delta Q$) in the case where the temperature is 25° C. FIG. 3 shows only the characteristic curve in the case of 25° C. However, actually, in the case of the application to an HEV, for example, characteristic curves that can cover a range from −30° C. to +60° C. are stored in the LUT 1081 as look-up data.

The polarization voltage Vpol obtained in the polarization voltage calculation section 108 is input to a second computation section 109 that functions as a low-pass filter (LPF). In the second computation section 109, time delay processing for adjusting the timing between the polarization voltage Vpol and an electromotive force Veq obtained in a subsequent electromotive force calculation section 113 and averaging processing for removing a fluctuation component corresponding to an unnecessary high-frequency component are performed, and the result is output as LPF (Vpol).

Furthermore, the voltage data V(n) from the voltage measuring section 102 and the current data I(n) from the current measuring section 103 are input to a data set selection section 110 as data sets. In the data set selection section 110, as a selection condition, in the case where the values of the current data I(n) in a charging direction (−) and a discharging direction (+) are in a predetermined range (e.g., ±50 A), there are a predetermined number or more (e.g., each 10 among 60 samples) of current data I(n) in the charging direction and the discharging direction, and the variation $\Delta Q$ of the accumulated capacity while data sets are being obtained is in a predetermined range (e.g., 0.3 Ah), the data sets of the voltage data V(n) and the current data I(n) are determined to be effective, and they are selected and output as effective data sets S (V(n), I(n)).

Figure 4:
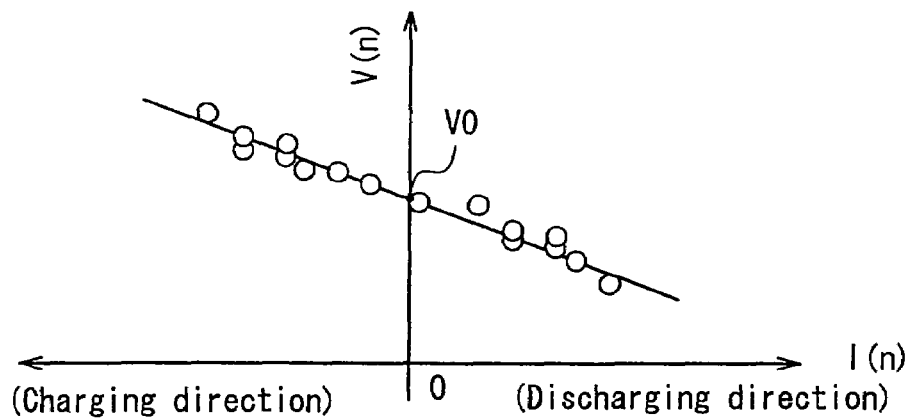
FIG. 4 is a diagram showing data sets of voltage data V(n) and current data I(n) and an approximate line for obtaining a no-load voltage V0 from the data sets by statistical processing in the present embodiment.

The effective data sets S(V(n), I(n)) from the data set selection section 110 are input to a no-load voltage calculation section 111. In the no-load voltage calculation section 111, as shown in FIG. 4, a primary voltage-current line (approximate line) is obtained from the effective data sets S(V(n), I(n)) by statistical processing using least squares, and a voltage value (voltage (V) intercept) corresponding to 0 current is calculated as a no-load voltage V0.

The no-load voltage V0 from the no-load voltage calculation section 111 is input to a no-load voltage determination section 112. In the no-load voltage determination section 112, in the case where as a determination condition, a variance of the data sets S(V(n), I(n)) with respect to the approximate line is obtained and this variance is in a predetermined range, or a correlation coefficient between the approximate line and the data sets S(V(n), I(n)) is obtained and this correlation coefficient is a predetermined value or more, the calculated no-load voltage V0 is determined to be effective, and output as an effective no-load voltage $V0_{OK}$.

Figure 5:
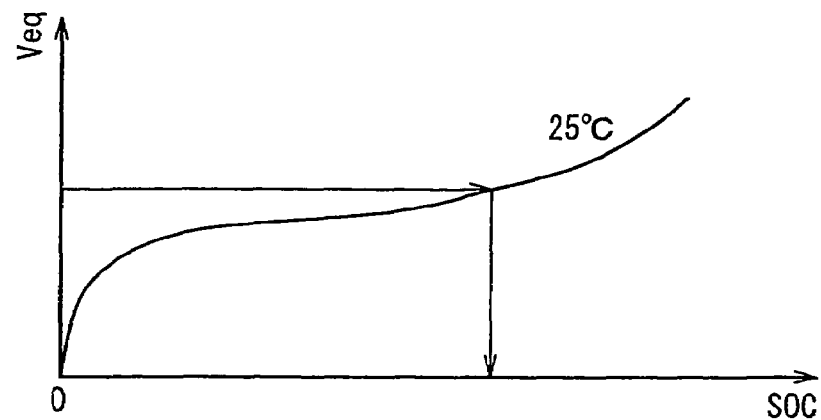
FIG. 5 is a diagram showing a characteristic curve of an electromotive force Veq with respect to a remaining capacity SOC, with a temperature being a parameter, in the present embodiment.

Next, the electromotive force calculation section 113 subtracts the polarization voltage LPF (Vpol) after filtering from the second computation section 109, from the effective no-load voltage $V0_{OK}$ from the no-load voltage determination section 112, as described above, thereby calculating an electromotive force Veq (equilibrium potential). The electromotive force Veq thus calculated is input to a remaining capacity estimation section 114. In the remaining capacity estimation section 114, a remaining capacity SOC is estimated based on the temperature data T(n) measured in the temperature measuring section 104, from a characteristic curve or a formula of the electromotive force Veq with respect to the remaining capacity SOC with a temperature being a parameter, previously stored in a look-up table (LUT) 1141. Herein, FIG. 5 shows a characteristic curve of the electromotive force Veq with respect to the remaining capacity SOC in the case of a temperature of 25° C. FIG. 5 shows only a characteristic curve in the case of 25° C. However, actually, in the case of the application to an HEV, for example, characteristic curves that can cover a range of −30° C. to +60° C. are stored in the LUT 1141 as look-up data.

Next, a processing procedure of estimating a remaining capacity in a battery pack system configured as described above will be described with reference to FIG. 6.

Figure 6:
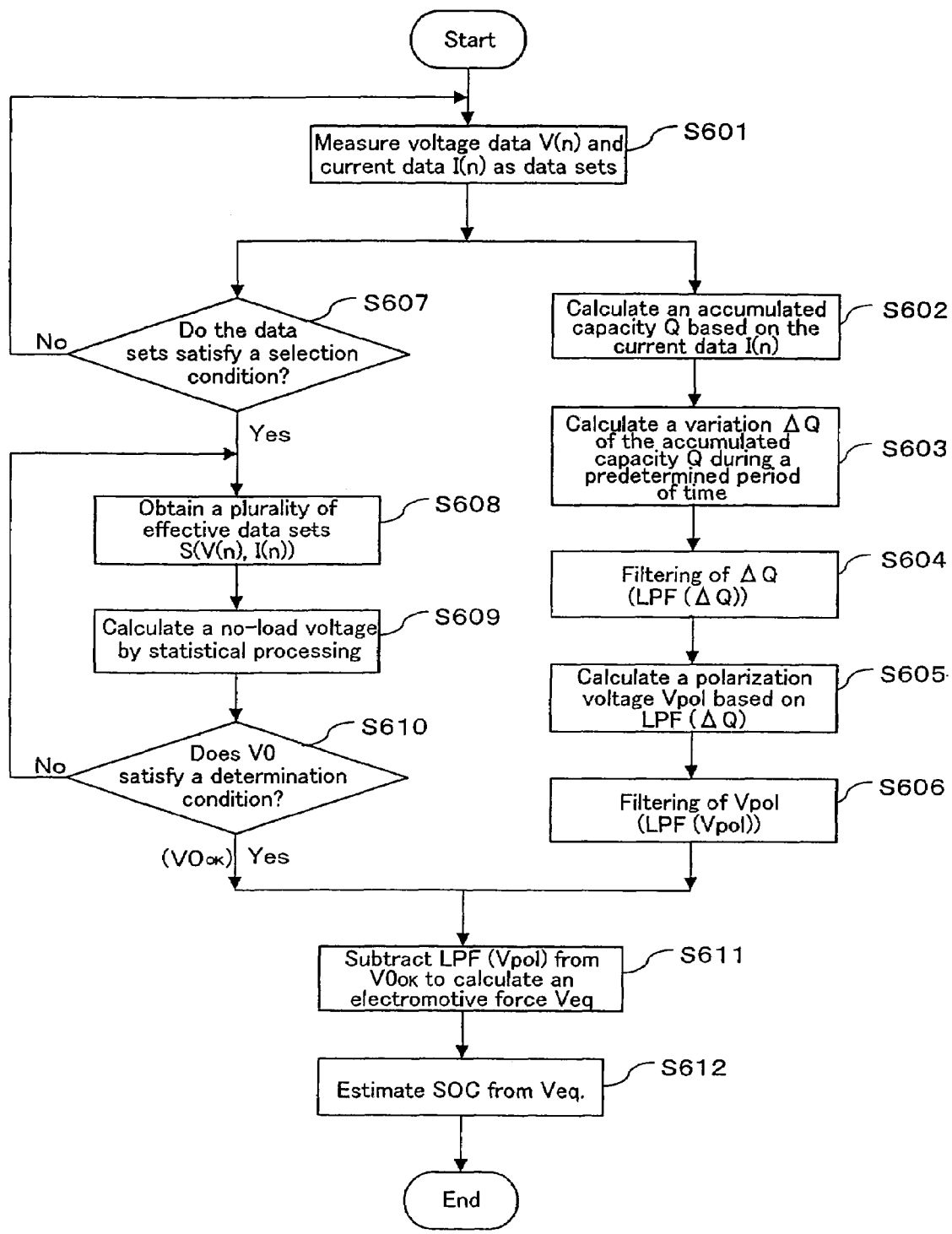
FIG. 6 is a flow chart showing a processing procedure in a method for estimating a remaining capacity of a secondary battery according to the present embodiment.

FIG. 6 is a flow chart showing a processing procedure in a method for estimating a remaining capacity of a secondary battery according to one embodiment of the present invention. In FIG. 6, voltage data V(n) and current data I(n) are measured as data sets (S601). Then, an accumulated capacity Q is calculated by accumulating currents, based on the current data I(n) (S602). Then, a variation $\Delta Q$ of the accumulated capacity Q during a predetermined period of time (e.g., one minute) is calculated (S603). Then, the variation $\Delta Q$ of the accumulated capacity is filtered (time delay and averaging processing) to compute LPF ($\Delta Q$) (S604). Then, a polarization voltage Vpol is calculated with reference to a look-up table previously storing polarization voltage Vpol-LPF ($\Delta Q$) characteristic data, with the temperature data T(n) being a parameter, from the computed LPF ($\Delta Q$) (S605). The above-mentioned Steps S601 to S605 are the processing procedure in a method for estimating a polarization voltage of the present invention. Then, the calculated polarization voltage Vpol is filtered (time delay and averaging processing), thereby computing LPF (Vpol) (S606).

Furthermore, in order to examine whether or not the data sets of the voltage data V(n) and the current data I(n) measured in Step S601 are effective, it is determined whether or not these data sets satisfy the selection condition as described above (S607). In the case where the data sets do not satisfy the selection condition in the determination in Step S607 (No), the process returns to Step S601, and the data sets of the voltage data V(n) and the current data I(n) are measured again. On the other hand, in the case where the data sets satisfy the selection condition in the determination in Step S607 (Yes), the process proceeds to Step S608, and a plurality of (e.g., each 10 in the charging and discharging directions among 60 samples) effective data sets S(V(n), I(n)) are obtained (S608).

Next, a primary approximate line (V-I line) is obtained from the effective data sets S(V(n), I(n)) by statistical processing using least squares. A V intercept of the approximate line is calculated as a no-load voltage V0 (S609). Then, in order to examine whether or not the no-load voltage V0 calculated in Step S609 is effective, it is determined whether or not the no-load voltage V0 satisfies the above-mentioned determination condition. In the case where the no-load voltage V0 does not satisfy the determination condition in the determination in Step S610 (No), the process returns to Step S608. Then, another plurality of (e.g., a different set of 10 among 60 samples) effective data sets S(V(n), I(n)) are obtained, and Steps S609 and S610 are repeated. On the other hand, in the case where the calculated no-load voltage V0 satisfies the determination condition in the determination in Step S610, the calculated no-load voltage V0 is set to be an effective no-load voltage $V0_{OK}$.

Thus, an electromotive force Veq of a battery is obtained from the obtained polarization voltage LPF (Vpol) after filtering and the obtained effective no-load voltage $V0_{OK}$. The electromotive force Veq is calculated by subtracting the polarization voltage LPF (Vpol) after filtering from the effective no-load voltage $V_{0OK}$. Next, a remaining capacity SOC is estimated with reference to a look-up table previously storing an electromotive force Veq-remaining capacity SOC characteristic data with the temperature data T(n) being a parameter, from the calculated electromotive force Veq (S612).

Next, the accuracy of the remaining capacity SOC estimated as described above will be described with reference to FIGS. 7 and 8, with respect to the case where the filtering in the first computation section 107 and the second computation section 109 shown in FIG. 1 and in Steps S604 and Step 606 shown in FIG. 2 is not performed, and the case where the filtering in the first computation section 107 and Step S604 is performed.

Figure 7:
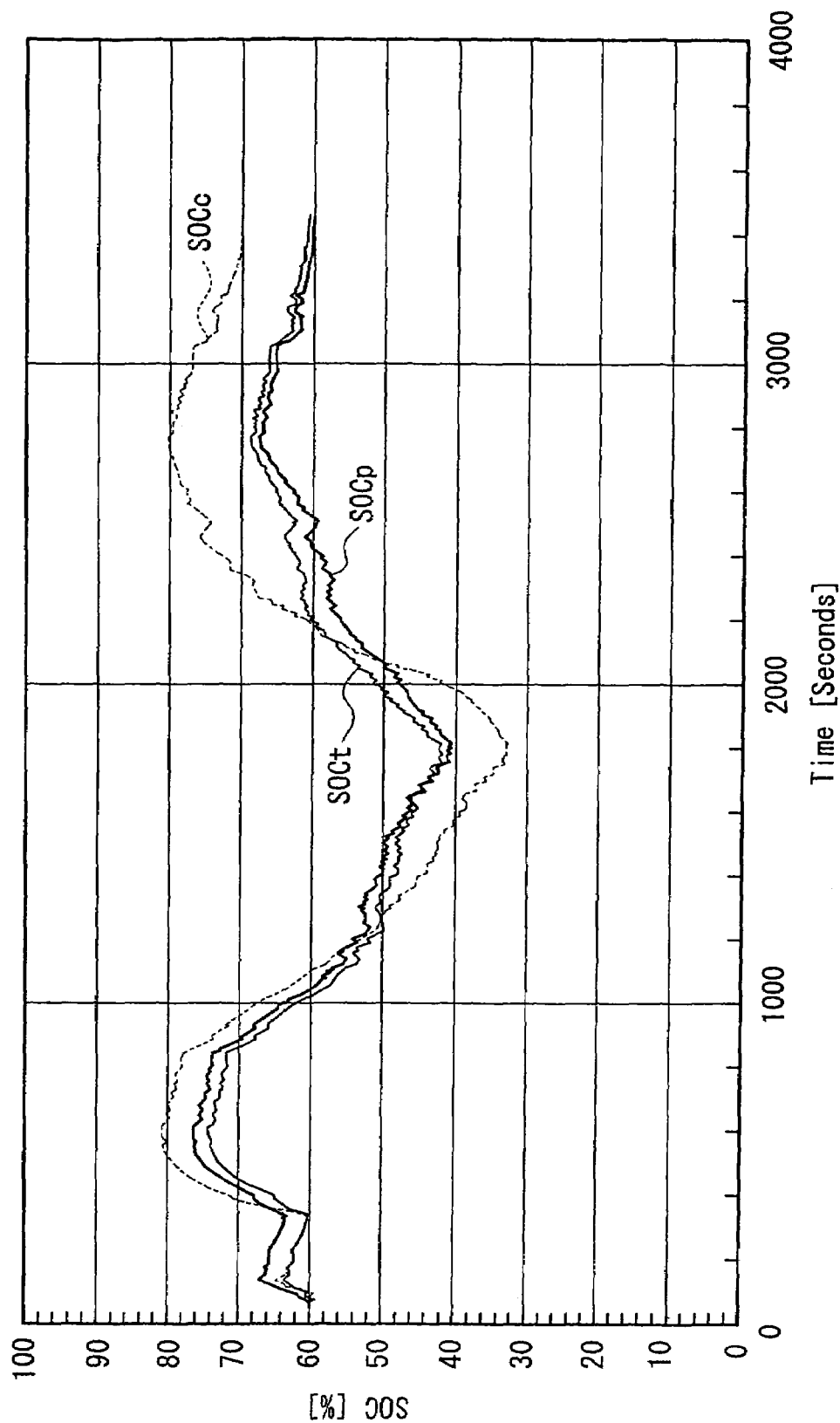
FIG. 7 is a diagram showing a change with the passage of time in a remaining capacity SOCp estimated in the present embodiment (in the case where a variation $\Delta Q$ of an accumulated capacity is not filtered), a remaining capacity SOCc estimated from a no-load voltage V0 in a conventional example, and a true remaining capacity SOCt.

FIG. 7 is a diagram showing a change with the passage of time in a remaining capacity SOCp estimated in the present embodiment, a remaining capacity SOCc estimated from a no-load voltage $V_0$ in a conventional example, and a true remaining capacity SOCt. As shown in FIG. 7, according to the conventional estimation method, there is a deviation of at most 10% or more with respect to the true remaining capacity SOCt; however, the remaining capacity SOCp estimated in the present embodiment has a deviation of 4% or less. Thus, the estimation accuracy of the remaining capacity SOC can be enhanced by 2.5 times or more. Particularly, in the case where the remaining capacity SOC is changed largely with the passage of time (for example, 1800 seconds to 2750 seconds in FIG. 7), according to the conventional example, there is a deviation of −10% to +12% (the range of a deviation is 22%) with respect to the true remaining capacity SOCt; however, according to the present embodiment, the deviation can be suppressed to be in a range of −2% to −4% (the range of a deviation is 4%). Thus, the estimation accuracy of the remaining capacity SOC can be enhanced further.

Figure 8:
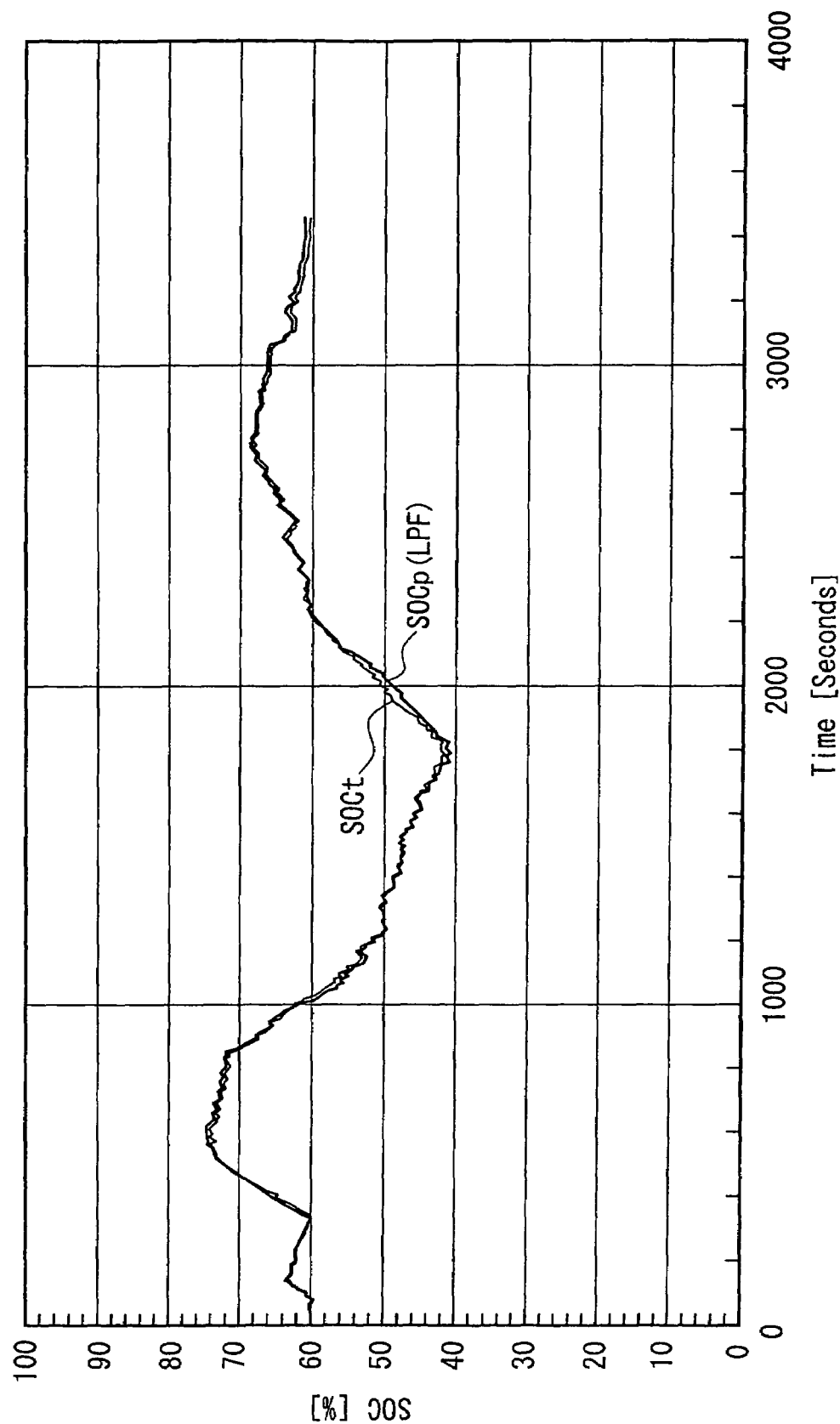
FIG. 8 is a diagram showing a change with the passage of time in a remaining capacity SOCp (LPF) estimated in the present embodiment (in the case where a variation $\Delta Q$ of an accumulated capacity is filtered), and a true remaining capacity SOCt.

FIG. 8 is a diagram showing a change with the passage of time in a remaining capacity SOCp (LPF) estimated in the present embodiment, and a true remaining capacity SOCt. As shown in FIG. 8, the variation ΔQ of the accumulated capacity is filtered, whereby the deviation of the remaining capacity SOCp can be suppressed to 2% or less with respect to the true remaining capacity SOCt, and the estimation accuracy of the remaining capacity SOC can be enhanced by 5 times or more compared with the conventional example.

Figure 9:
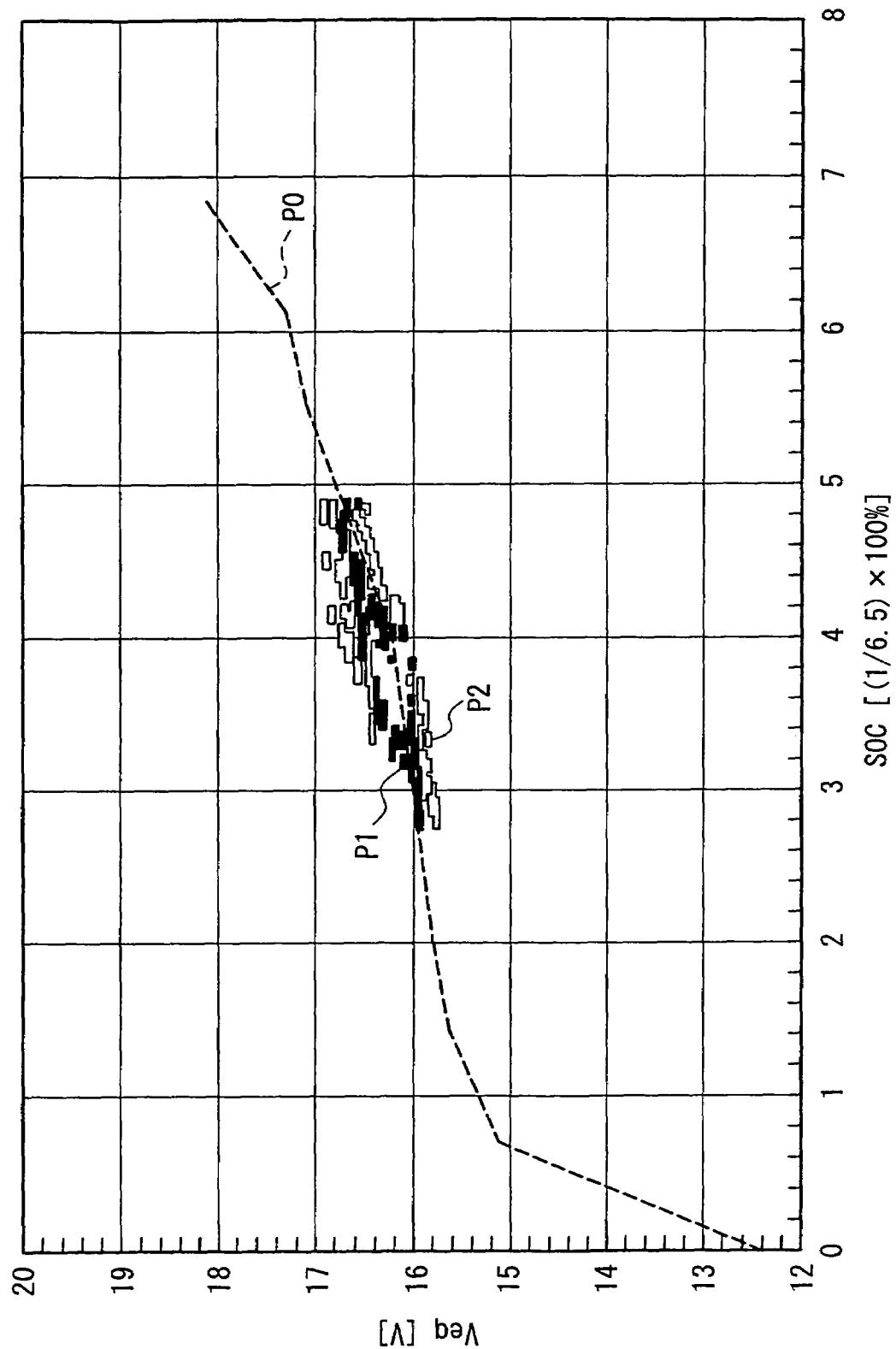
FIG. 9 is a diagram showing a true Veq-SOC curve (P0), and electromotive force-SOC plotted data in the case where a remaining capacity is estimated in the present embodiment (P1: in the case where a variation $\Delta Q$ of an accumulated capacity is not filtered) and in the case where a remaining capacity is estimated from a no-load voltage V0 in the conventional example (P2).
Figure 10:
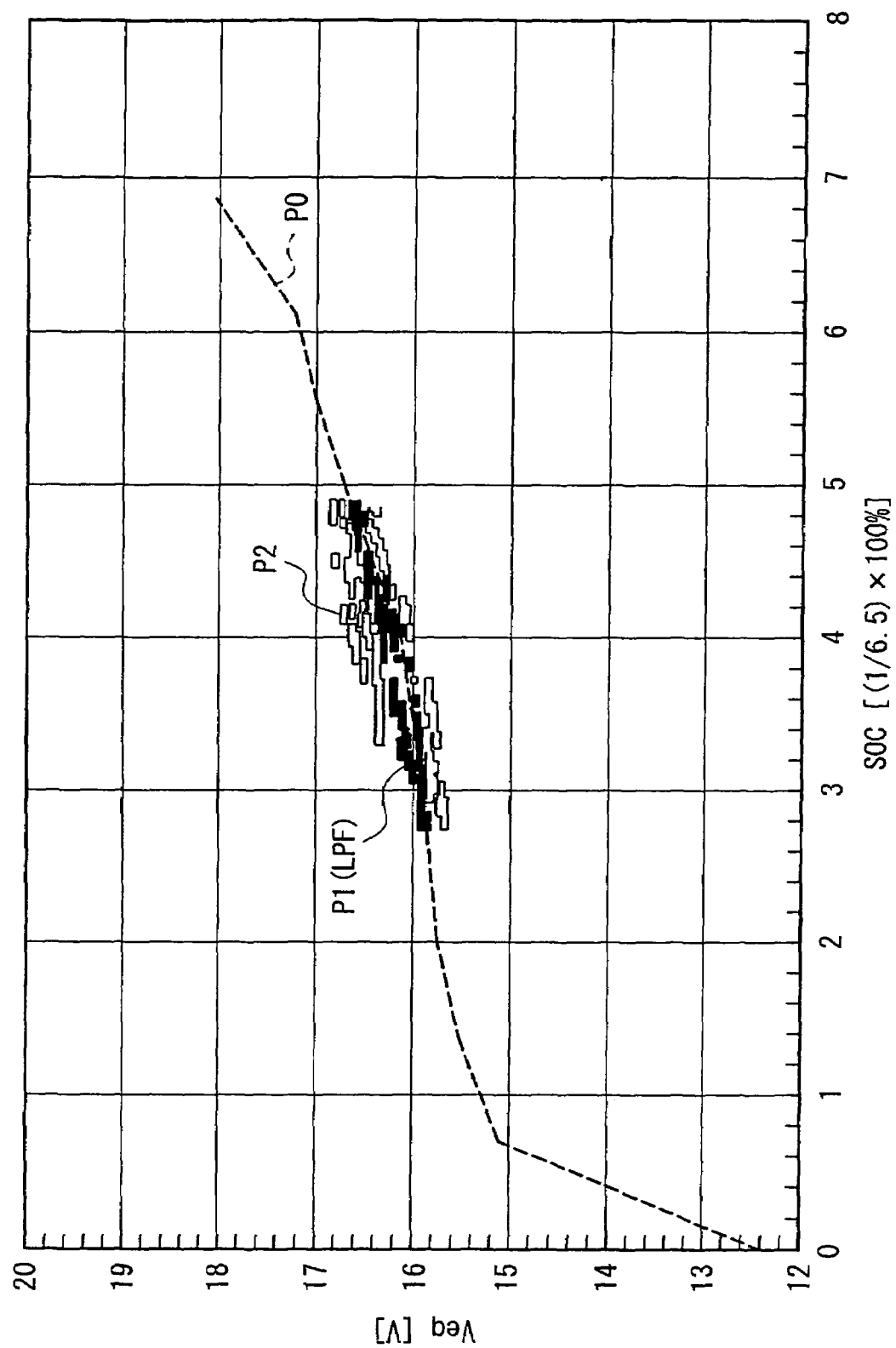
FIG. 10 is a diagram showing a true Veq-SOC curve (P0), and electromotive force-SOC plotted data in the case where a remaining capacity is estimated in the present embodiment (P1 (LPF): in the case where a variation $\Delta Q$ of an accumulated capacity is filtered) and in the case where a remaining capacity is estimated from a no-load voltage V0 in the conventional example (P2).
Figure 11:
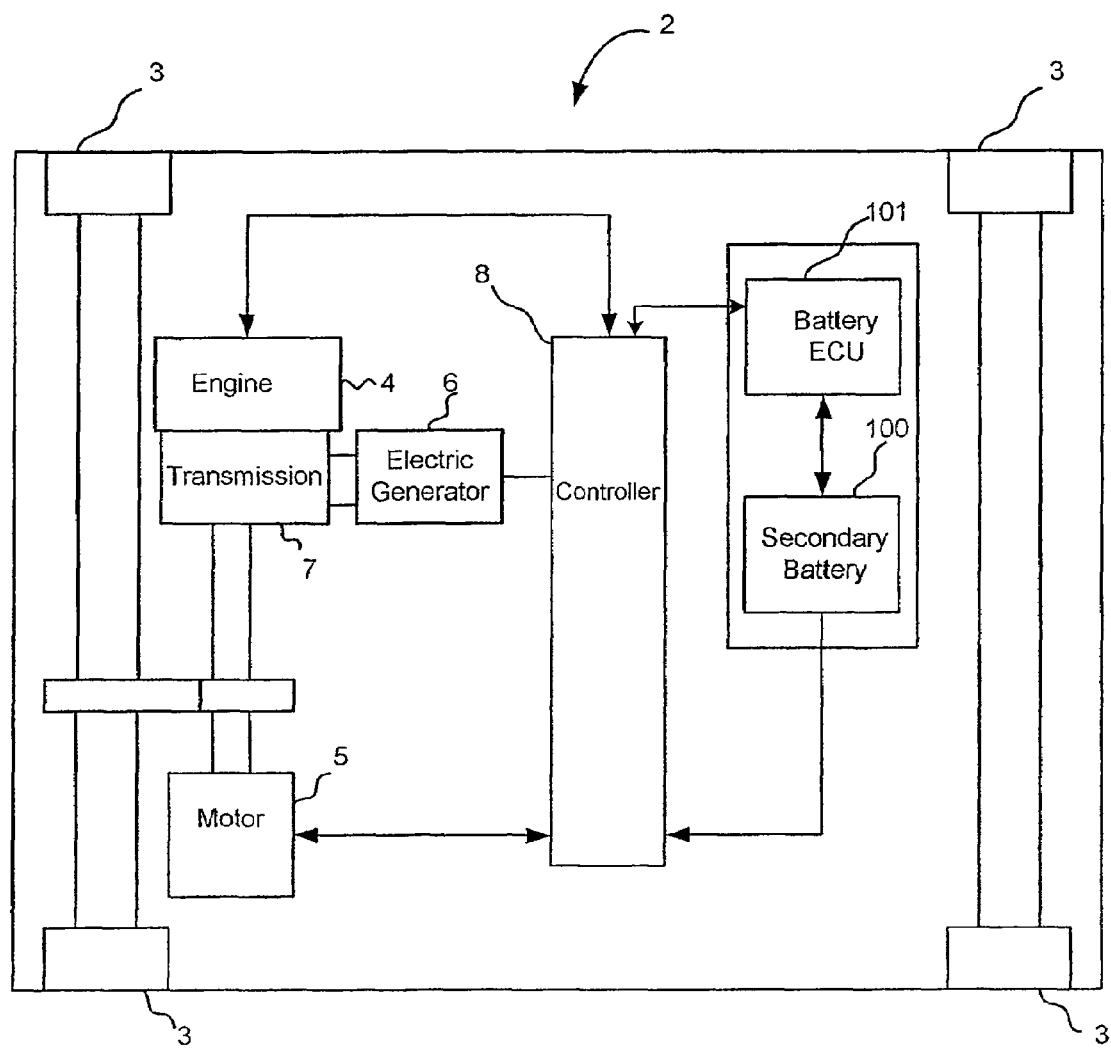
FIG. 11 is a block diagram showing a battery pack system 1 used in a hybrid electric vehicle (HEV) 2. The HEV 2 is provided with an engine 4 and a motor 5 for rotating wheels 3. The battery pack system 1 includes secondary battery 100 and an electronic control unit for a battery (battery ECU) 101. Charging/discharging of the secondary battery 100 is controlled by the battery ECU 101. An electric generator 6 is driven with surplus motive power trough a transmission 7 to charge a secondary battery 100 through a controller 9.

FIGS. 9 and 10 respectively are diagrams showing a true electromotive force Veq-remaining capacity SOC curve (P0), and electromotive force Veq-remaining capacity SOC plotted data in the case where a remaining capacity is estimated in the present embodiment (P1 and P1 (LPF)) and in the case where a remaining capacity is estimated from a no-load voltage V0 in a conventional example (P2).

As shown in FIG. 9, in the intermediate remaining capacity range (about 45% to about 75%) used in the application to an HEV, the variation of plotted data with respect to the true electromotive force Veq-remaining capacity SOC curve P0 is smaller in the present embodiment, compared with the conventional example. Furthermore, as shown in FIG. 10, in the case where the variation ΔQ of the accumulated capacity is filtered, the accuracy is further enhanced.

In the present embodiment, a predetermined period of time for calculating the variation ΔQ of the accumulated capacity is set to be, for example, one minute. However, the predetermined period of time may be varied in accordance with the driving state of a vehicle, in the case where the battery pack system is mounted on an HEV or the like. More specifically, the predetermined period of time is set to be short in the case where a secondary battery is charged/discharged frequently, and the predetermined period of time is set to be long in the case where the secondary battery is not charged/discharged frequently. Thus, a polarization voltage can be estimated optimally in accordance with an actual driving state.

Furthermore, in the present embodiment, a computation section is divided into the first computation section 107 and the second computation section 109 so as to perform filtering. They may be combined into one, if required. This can reduce the processing steps, and enhance the processing speed.

In the present embodiment, the polarization voltage is calculated in the absence of a load where there is no component resistance. However, a component resistance that can be previously measured easily is tabulated in advance and taken into consideration, whereby the polarization voltage and SOC can be calculated exactly in a similar manner even during a period of time other than a no-load period.

As described above, according to the present invention, the polarization voltage is obtained from the variation of the accumulated capacity, whereby the estimation accuracy of the polarization voltage is enhanced, and the calculation accuracy of a battery electromotive force (equilibrium potential) obtained by subtracting the polarization voltage from the no-load voltage is enhanced. Consequently, an SOC can be estimated with high accuracy.

Furthermore, the SOC can be estimated based on the equilibrium potential. Therefore, the SOC after self-discharging when being left for a long period of time, and the like can be estimated easily, which makes it unnecessary to periodically initialize the SOC.

The invention claimed is:
1. A method for estimating a polarization voltage of a secondary battery, comprising the steps of:
   measuring a current flowing through a secondary battery;
   calculating a first accumulated capacity by accumulating the measured current over a predetermined period of time;
   calculating a second accumulated capacity by accumulating the measured current over a next predetermined period of time;
   calculating a difference between the first accumulated capacity and the second accumulated capacity to obtain a variation of the calculated accumulated capacity; and
   obtaining a polarization voltage based on the variation of the accumulated capacity.
2. A method for estimating a polarization voltage of a secondary battery, comprising the steps of:
   measuring a current flowing through a secondary battery used in an intermediately charged state as a power source for a motor and a driving source for a load;

calculating a first accumulated capacity by accumulating the measured current over a predetermined period of time;

calculating a second accumulated capacity by accumulating the measured current over a next predetermined period of time;

calculating a difference between the first accumulated capacity and the second accumulated capacity to obtain a variation of the accumulated capacity; and obtaining a polarization voltage based on the variation of the accumulated capacity.

3. A battery pack system, comprising:

a secondary battery; and an electric control unit for a battery (battery ECU) for estimating a polarization voltage of the secondary battery, wherein the electric control unit is configured to
measure a current flowing through a secondary battery,
calculate a first accumulated capacity by accumulating the measured current over a predetermined period of time,
calculate a second accumulated capacity by accumulating the measured current over a next predetermined period of time,
calculate a difference between the first accumulated capacity and the second accumulated capacity to obtain a variation of the accumulated capacity, and
obtain a polarization voltage based on the variation of the accumulated capacity.

4. A motor-driven vehicle, comprising:

a battery pack system mounted on a motor, the battery pack system comprising a secondary battery and a battery ECU for estimating a polarization voltage of the secondary battery, wherein the battery ECU is configured to
measure a current flowing through a secondary battery,
calculate a first accumulated capacity by accumulating the measured current over a predetermined period of time,
calculate a second accumulated capacity by accumulating the measured current over a next predetermined period of time, calculate a difference between the first accumulated capacity and the second accumulated capacity to obtain a variation of the accumulated capacity, and
obtain a polarization voltage based on the variation of the accumulated capacity.

5. A method for estimating a remaining capacity of a secondary battery, comprising the steps of:

measuring a data set of a current flowing through a secondary battery and a terminal voltage of the secondary battery corresponding to the current, and obtaining a plurality of the data sets;

calculating a voltage value in a case where a current value is zero based on the obtained plurality of data sets by statistical processing as a no-load voltage;

calculating a first accumulated capacity during a predetermined period of time based on the measured current;

calculating a second accumulated capacity during a next predetermined period of time based on the measured current;

calculating a difference between the first accumulated capacity and the second accumulated capacity to obtain a variation of the accumulated capacity;

obtaining a polarization voltage based on the variation of the accumulated capacity;

subtracting the polarization voltage from the no-load voltage to calculate an electromotive force of the secondary battery; and estimating a remaining capacity of the secondary battery based on the calculated electromotive force.

6. A method for estimating a remaining capacity of a secondary battery, comprising the steps of:

measuring a data set of a current flowing through a secondary battery used in an intermediately charged state as a power source for a motor and a driving source for a load, and a terminal voltage of the secondary battery corresponding to the current to obtain a plurality of the data sets;

calculating a voltage value in a case where a current value is zero based on the obtained plurality of data sets by statistical processing as a no-load voltage;

calculating a first accumulated capacity during a predetermined period of time based on the measured current;

calculating a second accumulated capacity during a next predetermined period of time based on the measured current;

calculating a difference between the first accumulated capacity and the second accumulated capacity to obtain a variation of the calculated accumulated capacity;

obtaining a polarization voltage based on the variation of the accumulated capacity;

subtracting the polarization voltage from the no-load voltage to calculate an electromotive force of the secondary battery; and estimating a remaining capacity of the secondary battery based on the calculated electromotive force.

7. A battery pack system, comprising:

a secondary battery; and a battery ECU for estimating a remaining capacity of the secondary battery, wherein the battery ECU is configured to
measure a data set of a current flowing through a secondary battery and a terminal voltage of the secondary battery corresponding to the current, and obtaining a plurality of the data sets,
calculate a voltage value in a case where a current value is zero based on the obtained plurality of data sets by statistical processing as a no-load voltage,
calculate a first accumulated capacity during a predetermined period of time based on the measured current,
calculate a second accumulated capacity during a next predetermined period of time based on the measured current,
calculate a difference between the first accumulated capacity and the second accumulated capacity to obtain a variation of the accumulated capacity,
obtain a polarization voltage based on the variation of the accumulated capacity,
subtract the polarization voltage from the no-load voltage to calculate an electromotive force of the secondary battery, and
estimate a remaining capacity of the secondary battery based on the calculated electromotive force.

8. A motor-driven vehicle comprising:

a battery pack system mounted on a motor, the battery pack system comprising a secondary battery and a battery ECU for estimating a remaining capacity of the secondary battery, wherein the battery ECU is configured to
measure a data set of a current flowing through a secondary battery used in an intermediately charged state as a power source for a motor and a driving source for a load, and a terminal voltage of the secondary battery corresponding to the current to obtain a plurality of the data sets, calculate a voltage value in a case where a current value is zero based on the obtained plurality of data sets by statistical processing as a no-load voltage, calculate a first accumulated capacity during a predetermined period of time based on the measured current, calculate a second accumulated capacity during a next predetermined period of time based on the measured current, calculate a difference between the first accumulated capacity and the second accumulated capacity to obtain a variation of the accumulated capacity, obtain a polarization voltage based on the variation of the accumulated capacity, subtract the polarization voltage from the no-load voltage to calculate an electromotive force of the secondary battery, and estimate a remaining capacity of the secondary battery based on the calculated electromotive force.

9. An apparatus for estimating a remaining capacity of a secondary battery, comprising:

an electric current measuring section for measuring an electric current flowing through a secondary battery as current data;

a voltage measuring section for measuring a terminal voltage of the secondary battery corresponding to the current as voltage data;

a no-load voltage calculation section for calculating voltage data in a case where current data is zero as a no-load voltage by statistical processing, based on a plurality of data sets of the current data from the electric current measuring section and the voltage data from the voltage measuring section;

an accumulated capacity calculation section for calculating a first accumulated capacity during a predetermined period of time and a second accumulated capacity during a next predetermined period of time based on current data from the electric current measuring section and;

a capacity change calculation section for calculating a difference between the first accumulated capacity and the second accumulated capacity to obtain a variation of the accumulated capacity;

a polarization voltage calculation section for obtaining a polarization voltage based on the variation of the accumulated capacity from the capacity change calculation section;

an electromotive force calculation section for subtracting a polarization voltage obtained in the polarization voltage calculation section from the no-load voltage calculated in the no-load voltage calculation section to calculate an electromotive force of the secondary battery; and a remaining capacity estimation section for estimating a remaining capacity of the secondary battery based on the electromotive force from the electromotive force calculation section.

10. An apparatus for estimating a remaining capacity of a secondary battery, comprising:

a current measuring section for measuring a current flowing through a secondary battery used in an intermediately charged state as a power source for a motor and a driving source for a load as current data;

a voltage measuring section for measuring a terminal voltage of the secondary battery corresponding to the current as voltage data;

a no-load voltage calculation section for calculating voltage data in a case where current data is zero as a no-load voltage by statistical processing, based on a plurality of data sets of the current data from the current measuring section and the voltage data from the voltage measuring section;

an accumulated capacity calculation section for calculating a first accumulated capacity during a predetermined period of time and a second accumulated capacity during a next predetermined period of time based on current data from the current measuring section;

a capacity change calculation section for calculating a difference between the first accumulated capacity and the second accumulated capacity to obtain a variation of the accumulated capacity;

a polarization voltage calculation section for obtaining a polarization voltage based on the variation of the accumulated capacity from the capacity change calculation section;

an electromotive force calculation section for subtracting a polarization voltage obtained in the polarization voltage calculation section from the no-load voltage calculated in the no-load voltage calculation section to calculate an electromotive force of the secondary battery; and a remaining capacity estimation section for estimating a remaining capacity of the secondary battery based on the electromotive force from the electromotive force calculation section.

11. The apparatus according to claim 10, wherein the apparatus for estimating a remaining capacity of a secondary battery is configured as a battery ECU in a motor driven vehicle.

12. A battery pack system, comprising:

a secondary battery; and a battery ECU for estimating a polarization voltage of the secondary battery, wherein the battery ECU is configured to measure a current flowing through a secondary battery used in an intermediately charged state as a power source for a motor and a driving source for a load, calculate a first accumulated capacity by accumulating the measured current over a predetermined period of time, calculate a second accumulated capacity by accumulating the measured current over a next predetermined period of time, calculate a difference between the first accumulated capacity and the second accumulated capacity to obtain a variation of the accumulated capacity, and obtain a polarization voltage based on the variation of the accumulated capacity.

13. A battery pack system, comprising:

a secondary battery; and a battery ECU for estimating a remaining capacity of the secondary battery, wherein the battery ECU is configured to measure a data set of a current flowing through a secondary battery used in an intermediately charged state as a power source for a motor and a driving source for a load, and a terminal voltage of the secondary battery corresponding to the current to obtain a plurality of the data sets, calculate a voltage value in a case where a current value is zero based on the obtained plurality of data sets by statistical processing as a no-load voltage, calculate a first accumulated capacity during a predetermined period of time based on the measured current, calculate a second accumulated capacity during a next predetermined period of time based on the measured current, calculate a difference between the first accumulated capacity and the second accumulated capacity to obtain a variation of the accumulated capacity, obtain a polarization voltage based on the variation of the accumulated capacity, subtract the polarization voltage from the no-load voltage to calculate an electromotive force of the secondary battery, and estimate a remaining capacity of the secondary battery based on the calculated electromotive force.

14. A battery pack system, comprising: the apparatus for estimating a remaining capacity of a secondary battery of claim 10; and the secondary battery.

15. The battery pack system according to claim 14, wherein the apparatus for estimating a remaining capacity of a secondary battery is configured as a battery ECU.

16. A battery pack system, comprising: the apparatus estimating a remaining capacity of a secondary battery of claim 9; and the secondary battery.

17. The battery pack system according to claim 16, wherein the apparatus for estimating a remaining capacity of a secondary battery is configured as a battery ECU.

18. The motor-driven vehicle on which a battery pack system comprising the apparatus for estimating a remaining capacity of a secondary battery of claim 10 and the secondary battery is mounted.

* * * * *